US007009536B1

(12) United States Patent
Gaus, Jr.

(10) Patent No.: US 7,009,536 B1
(45) Date of Patent: Mar. 7, 2006

(54) ANALOG-TO DIGITAL CONVERTER COMPENSATING APPARATUS AND ASSOCIATED METHODS

(75) Inventor: Richard C. Gaus, Jr., Burnt Hills, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 11/017,458

(22) Filed: Dec. 20, 2004

Related U.S. Application Data

(60) Provisional application No. 60/626,783, filed on Nov. 10, 2004.

(51) Int. Cl.
*H03M 1/06* (2006.01)
(52) U.S. Cl. ...................................... 341/118; 341/120
(58) Field of Classification Search ................ 341/118, 341/120, 155
See application file for complete search history.

(56) References Cited

U.S. PATENT DOCUMENTS

| 5,266,951 | A | * | 11/1993 | Kuegler et al. | ............. | 341/120 |
| 5,361,067 | A | * | 11/1994 | Pinckley | ...................... | 341/120 |
| 6,127,955 | A | * | 10/2000 | Handel et al. | ............... | 341/120 |
| 6,424,275 | B1 | * | 7/2002 | Velazquez | ................... | 341/118 |
| 6,690,311 | B1 | * | 2/2004 | Lundin et al. | ............... | 341/120 |
| 2002/0093439 | A1 | * | 7/2002 | Lundin et al. | ............... | 341/120 |

OTHER PUBLICATIONS

Tsimbinos, J., "Improved error-table compensation of A/D converters", *IEE Proceedings-Circuits Devices Systems*, vol. 144, No. 6, pp. 343-349, (Dec. 1997).
Beaumont-Smith, A. "A VLSI Chip Implementation of an A/D Converter Error Table Compensator", *Third International Conference on Advanced A/D and D/A Conversion Techniques and Their Applications, 1999*, Conf. pub. No. 466, 1999, pp. 122-125, unknown month.
G.A. Friel, "Simultaneous Compensation of Previous Sample and Slope Dependent Errors in Analog to Digital Converters", *Third International Conference on Advanced A/D and D/A Conversion Techniques and Their Applications, 1999*, Conf. pub. No. 466, 1999, pp. 160-163, unknown month.
Hummels, D.M. "Characterization of ADCs Using a Non-Iterative Procedure", *1994 IEEE International Symposium on Circuits and Systems, 1994, ISCAS '94*, vol. 2, 1994, pp. 5-8, unknown month.
Hummels, D.M. "Linearization of ADCs and DACs for All Digital Wide-Bandwidth Receivers," *IMEKO TC-4 Symposium on Development in Digital Measuring Instrumentation and 4th Workshop on ADC Modeling and Testing*, Bordeaux, France, Sep. 9-10, 1999.
Tsimbinos, J. "Identification and Compensation of Nonlinear Distortion", Institute for Telecommunications Research, School of Electronic Engineering, University of South Australia, The Levels, South Australia 5095, Feb. 1995.
Kelso, G. "Fast Calibration of Analog to Digital Converters", M.S. thesis, The Graduate School, University of Maine, Aug. 1999.

* cited by examiner

*Primary Examiner*—Peguy JeanPierre
*Assistant Examiner*—Khai Nguyen
(74) *Attorney, Agent, or Firm*—Bracewell & Giuliani LLP

(57) ABSTRACT

An analog-to-digital converter compensating apparatus and associated methods are provided. The apparatus can include an ADC, a state-slope sampler responsive to output data of the ADC to produce a state sample and a slope sample, a compensator which can include memory having an error-table associated therewith to provide an error or compensation sample to a combiner which combines the compensation sample with the state value to provide a compensated ADC output, and a compensator error processor positioned to receive the state sample, the slope sample, and an updated error value to dynamically update the compensator and thereby dynamically update the compensated ADC output.

19 Claims, 7 Drawing Sheets

ANALOG-TO DIGITAL CONVERTER COMPENSATING APPARATUS AND ASSOCIATED METHODS

RELATED APPLICATIONS

This application is related to and claims the priority and benefit of U.S. Provisional Patent Application Ser. No. 60/626,783, filed Nov. 10, 2004, titled "Analog-To-Digital Converter Compensating Apparatus and Associated Methods," which is incorporated herein by reference in its entirety.

BACKGROUND OF THE INVENTION

1. Field of the Invention

The present invention relates to analog-to-digital converters and, more particularly, to compensation of analog-to-digital converters and associated methods.

2. Description of Related Art

An analog-to-digital converter (ADC), such as used in digital radio receiver applications, often needs to meet a requirement of having a very high spurious-free dynamic range (SFDR), typically greater than 100 dB. Current ADC devices attempt to come close to this requirement with compensation applied internally to the ADC. This results in an SFDR of about 90 to 100 dB. Additional increases in SFDR also have attempted to be achieved by external application of a compensating signal to the ADC output and have seen an improvement of about 10 to 15 dB. External compensation is often done with the use of a look-up table of error values.

For example, FIG. 1 illustrates a prior art ADC external compensation circuit. In normal operation, a desired analog signal 9 is provided as an input to an ADC 10, along with a sampling clock or timing signal 11. The output of the ADC 10 is both delayed by a delay 12 to provide state samples x and differentiated by a differentiator 14 to provide slope samples x'. The state and slope samples x, x' are provided to an address location 16 of an error-table stored in a random access memory (RAM) device 15. The RAM device 15 produces error compensation samples e from a data port 17 of the RAM device. The state samples x are also provided to a first register 18, and the error compensation samples e are provided to a second register 19 as shown. The error compensation samples e then are subtracted from the ADC output at the correct sampling time 11 at a combiner 20 to provide a compensated ADC output 25. Applicant, however, has recognized that this prior art ADC external compensation circuit is based only on the values residing in the look-up error-table of the RAM device 15 and is not responsive to dynamically changing environmental conditions that characterize given applications, such as an actual digital radio receiver environment, encompassing not only the ADC itself, but all of the components preceding it as well.

Some other prior error-table ADC compensation techniques have been attempted which produce a state—state or a state-slope sample pair to address an error look-up table to get a corresponding error value to apply to the ADC output. Some of these techniques "estimate" the calibrating signal input to the ADC and computes the error. It, however, can be difficult to "estimate" the calibrating input signal, and an imprecise "estimate" of the input signal results in an imprecise estimate of the error.

Others of these techniques compute the error using a linear combination of basis functions where the weighting coefficients are computed in the frequency domain. These other techniques are more direct in attacking the elimination of the described spurious components by computing weighting coefficients in an attempt to minimize the error between the spurious frequency components of the calibration signals and the frequency components of the errors computed by the linear combination of the weights and the basis functions. The result can be an improvement in SFDR by about 10 to 15 dB. Many frequency components remain, however, and these other techniques result only in average behavior. Although errors computed by the basis function can be good in the vicinity of the calibration signal samples, the results tend to diverge away from these samples when error values are needed for other parts of the error-table.

Accordingly, Applicant has recognized that there remains a need for real time ADC compensation and a need to periodically refresh an error-table with up-to-date compensation data based on present environmental conditions directly and indirectly related to the ADC's operation and performance. There is also a need to further reduce or compensate for remaining frequency components in ADC compensation and for ADC compensation that produces better than average results.

SUMMARY OF THE INVENTION

In view of the foregoing, embodiments of the present invention advantageously provide an apparatus and associated methods to enhance compensation in an analog-to-digital converter (ADC) in real time and that periodically refreshes an error-table with up-to-date compensation data. The up-to-date compensation data advantageously can be based on present environmental conditions directly and indirectly related to the ADC's operation and performance in a desired application. Embodiments of the present invention advantageously provide an apparatus and associated methods to perform real-time compensation of an ADC output signal and simultaneously update an error-table as new error values are calculated.

Also, embodiments of the present invention advantageously provide an apparatus and associated methods that allow for use of calibration signals that only cover part of an error-table; the remainder of the error-table, for example, can be filled in through the use of two-dimensional interpolation using error values previously computed with the calibration signals. Embodiments of the present invention further provide an apparatus and methods which further permit external statistical analysis of an error-table through the use of an attached computer, e.g., external to the ADC compensation circuiting. This feature, for example, advantageously permits analysis of trends in the change of the error-table as time elapses. Such changes, for example, can be due to temperature, aging, and type of components preceding the ADC.

Embodiments of the present invention still further provide an apparatus and methods which perform real-time compensation of any ADC output by correcting for any non-linearities introduced by the ADC itself or introduced by any components preceding it. Updates to an error-table are done simultaneously with compensation as the ADC is periodically re-calibrated, and thus, the compensation can more closely track any environmental system changes to the ADC or any components preceding it.

An embodiment of an apparatus to enhance compensation of output of an analog-to-digital converter (ADC) according to the present invention includes an ADC having an analog input, a clocking input, and a digital output, a state-slope sampler including a delay positioned to receive the digital output from the ADC as an input and the clocking input and including a delay output indicating a state value, and a differentiator also positioned to receive the digital output from the ADC as an input and the clocking input to differentiate the digital output from the ADC and having a differentiator output indicating a slope value. The apparatus also includes a compensator having memory positioned to receive the delay output and the differentiator output and having an error-table associated therewith, a first address input receiving each of the respective delay and differentiator outputs, a second address input, an error data input, and an error data output, a first register also positioned to receive the delay output and the clocking input and having a first register output, a second register positioned to receive the error data output and the clocking input and having a second register output, and a combiner positioned to receive the first register output and the second register output and to combine the second register output with the first register output to thereby compensate the first register output by the second register output. The apparatus further includes a compensating error processor positioned to receive the delay output, the differentiator output, and the clocking input to thereby compute new updated error-table values and update selected locations in the error-table associated with the memory with the updated error-table values. The compensating error processor has first and second updated processor outputs and an updated error output. The first and second updated processor outputs, for example, can be state and slope values, e.g., updated, associated with the updated error output and can be positioned to be inputted to the second address input of the memory. The updated error output also can be positioned to be inputted to the error data input of the memory so that the updated error values update or revise, or otherwise operate to compensate, the error-table associated with the memory.

Another embodiment of an apparatus to enhance compensation of output of an analog-to-digital converter (ADC) according to the present invention includes an ADC, a state-slope sampler responsive to output data of the ADC to produce a state sample and a slope sample, a compensator having memory responsive to the plurality of state-slope samples and having error data associated therewith to thereby produce a plurality of compensation samples, and a combiner positioned to combine each of the plurality of compensation samples from each of the plurality of state-slope samples, and a compensating error processor positioned to update the error data associated with the memory. The apparatus also can include the compensating eror processor having an update error counter responsive to an error control signal to update an error count, an update mean squared error calculator responsive to the error control signal to calculate an updated mean squared error, an update mean error controller to calculate an updated mean error, and an address driver and data transceiver responsive to the state control values, slope control values, the updated mean squared error value, and the updated error count to provide updated state values, updated slope values, and updated error values therefrom. The updated state values, updated slope values, and updated error values are then supplied to the memory of the compensator.

Embodiments of methods to enhance compensation of an analog-to-digital converter (ADC) output are also provided according to the present invention. For example, an embodiment of a method includes providing a digital output of an ADC, compensating for error in the digital output responsive to an error-table, and dynamically updating the error-table. The dynamically updating can include determining an updated error-value for the error-table responsive to a weighted sum of a previous error value in the error-table and the updated error value. The method can also include accessing the updated error-table to monitor performance of the updated error-table for statistical distribution of error values via an external computer and modifying an error-table location to enhance ADC compensation performance characteristics.

Accordingly, embodiments of an apparatus and methods of the present invention, for example, compensate an output of an ADC by removing non-linearities and other spurious components due to the ADC itself or due to non-linear effects preceding the ADC. Embodiments of an apparatus for compensating an ADC according to the present invention, for example, can use dual port memory (error-table) that is addressed sample-by-sample by data-pairs of ADC output values (state values) and sampled estimates of the slope of an input signal (slope values). The state-slope pairs address the dual-ported memory, e.g., random access memory (RAM), and produce compensatory values, which then are applied to the ADC output samples. The result is a compensated ADC signal with undesired components removed or reduced in amplitude.

Additionally, embodiments of an apparatus and methods of the present invention compute the compensating values for the error-table when known calibration signals are applied to the ADC input. Embodiments, for example, simultaneously compensate the ADC output and compute and update entries to the error-table. During completion of new error-table entries, any locations of the error-table which are not covered by the calibration signals input to the ADC during calibration phase of operation, for example, can be filled in by the use of two-dimensional interpolation using the known error-table values. Error-table values and statistical quantities, for example, can be available to an attached computer for off-line analysis of the performance of the compensation process.

BRIEF DESCRIPTION OF THE DRAWINGS

Some of the features and advantages of the present invention having been stated, others will become apparent as the description proceeds when taken in conjunction with the accompanying drawings, in which.

DETAILED DESCRIPTION

Figure 1:
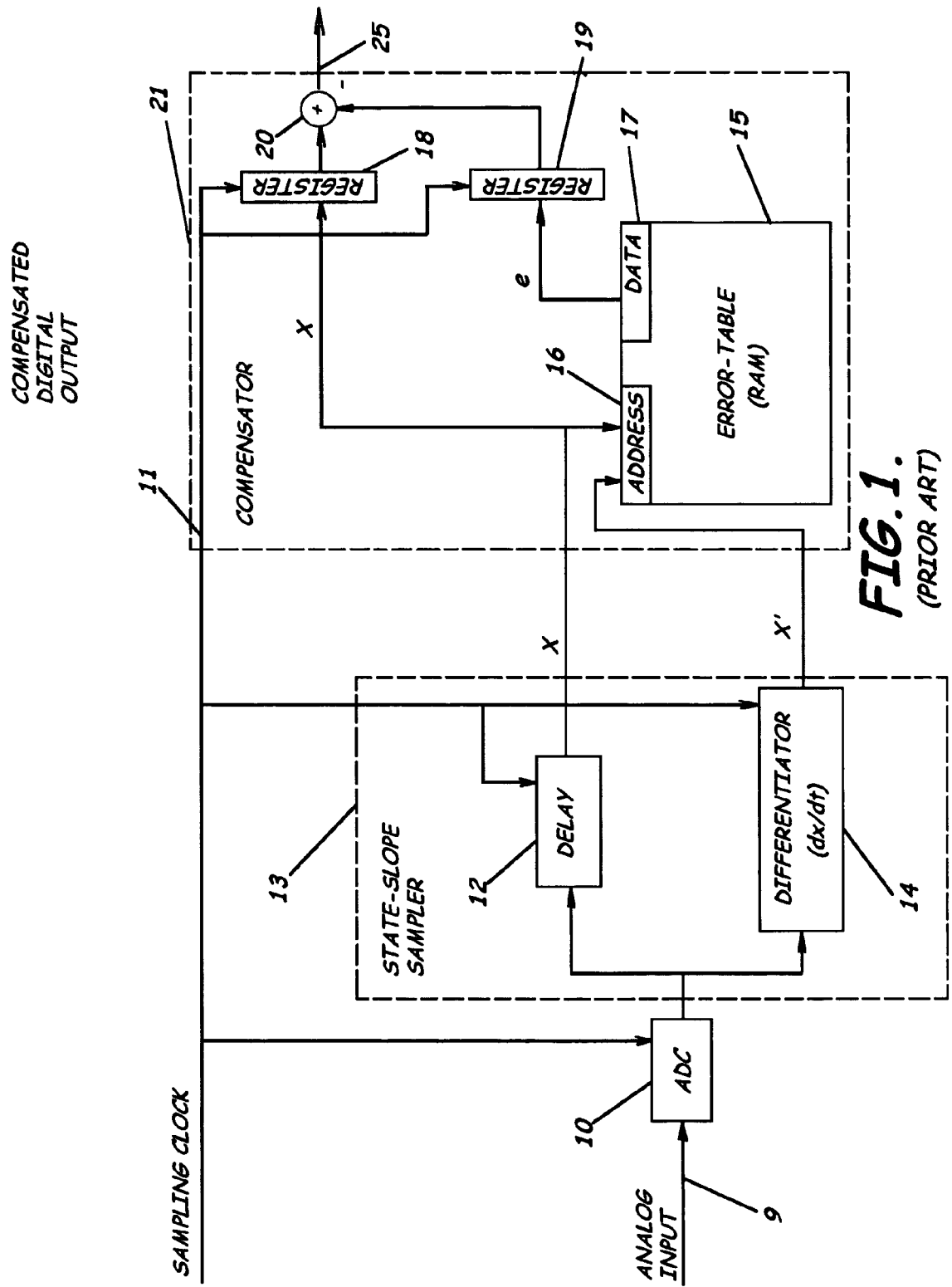
FIG. 1 is a schematic diagram of an analog-to-digital (ADC) compensation circuit according to the prior art.
Figure 2:
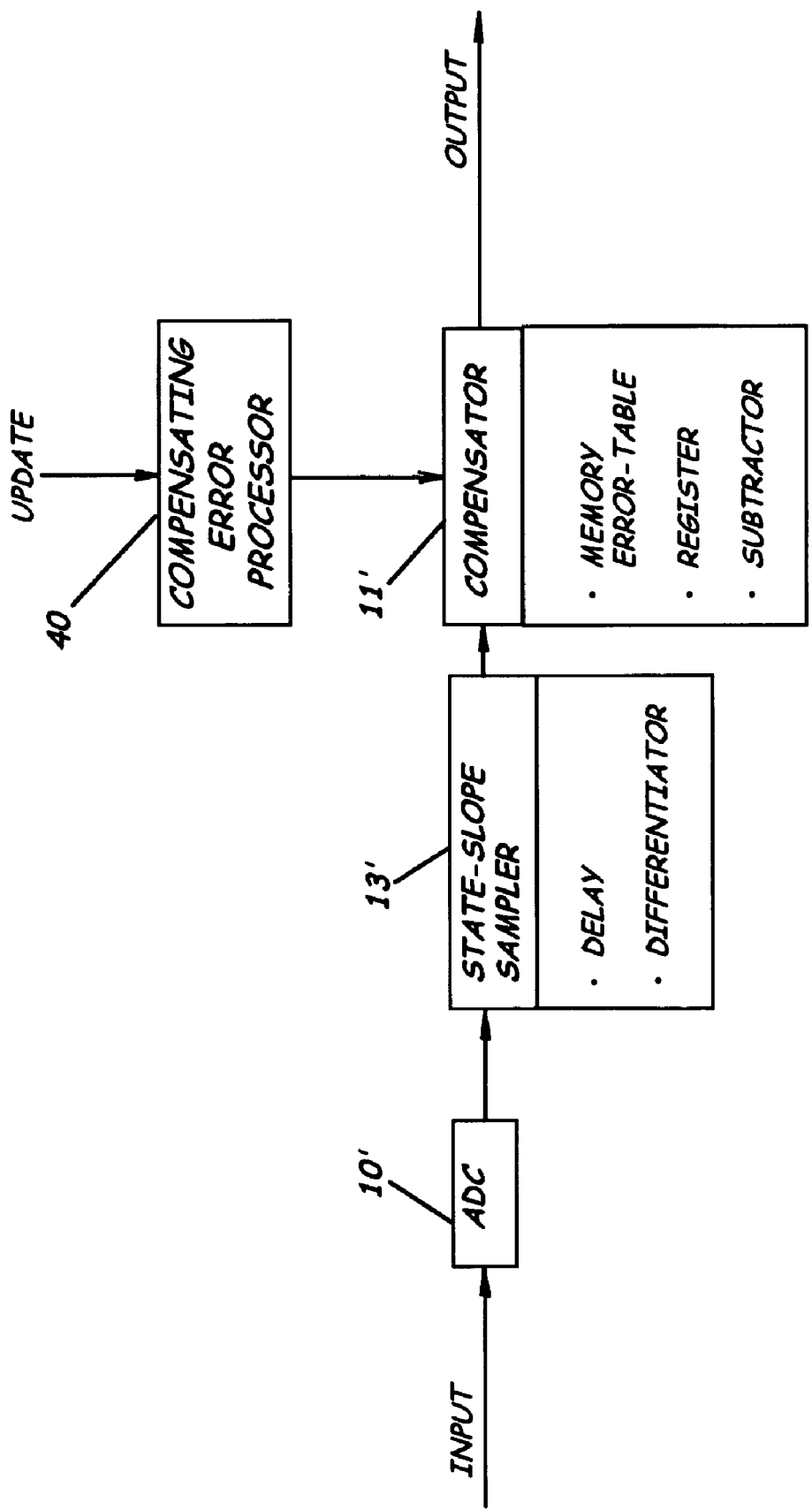
FIG. 2 is a schematic diagram of an ADC compensating apparatus according to an embodiment of the present invention.
Figure 3:
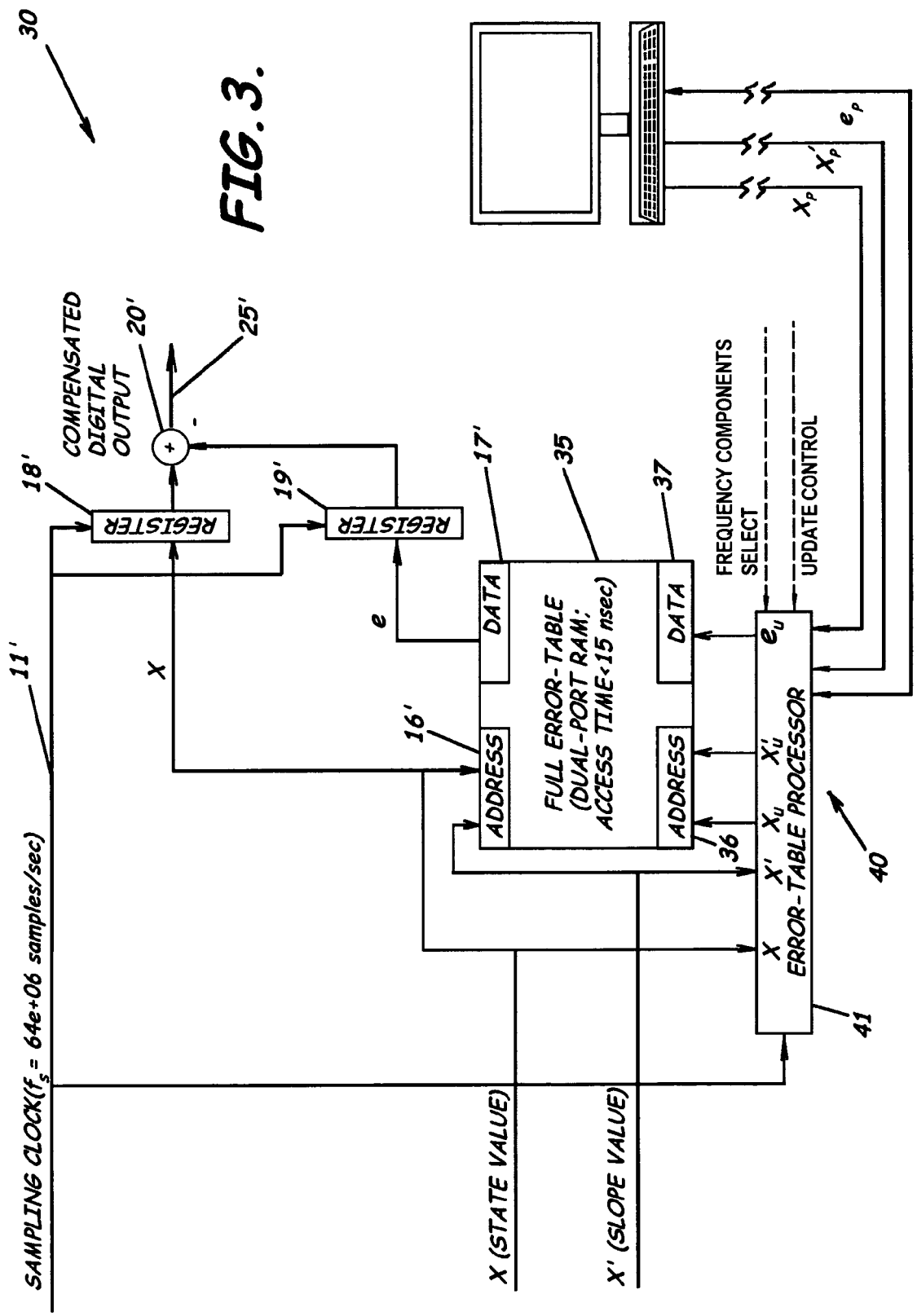
FIG. 3 is a schematic diagram of an ADC compensating apparatus according to an embodiment of the present invention.

The present invention now will be described more fully hereinafter with reference to the accompanying drawings in which embodiments of the invention are shown. This invention may, however, be embodied in many different forms and should not be construed as limited to the embodiments set forth and illustrated herein; rather, these embodiments are provided so that this disclosure will be thorough and complete, and will fully convey the scope of the invention to those skilled in the art. Like numbers refer to like elements throughout, and prime notation used in association with like numbers indicates like elements in alternative embodiments.

FIGS. 2–7 illustrates embodiments of an apparatus 30 and methods to enhance compensation of an analog-to-digital converter (ADC) 10' according to the present invention. An embodiment of an apparatus 30 of the present invention, for example, includes an ADC 10, 10' having an analog input 9', a clocking signal input 11', and a digital output. A state-slope sampler 13 such as provided by a slope estimator is positioned to receive the digital output of the ADC. The slope estimator, for example, can be provided by a delay 12' positioned to receive the digital output as an input thereto and the clocking signal input 11' to produce a delay output indicating a state value x. The slope estimator also can include a differentiator 14' positioned to receive the digital output from the ADC 10' as an input and the clocking signal input to produce a differentiated output indicating a slope value x'. The state value x and the slope value x' are received as inputs at a first address 16 of memory 35 and as inputs to a compensating error processor 40, such as including an error-table processor 41 as illustrated in FIGS. 2–7. The memory 35, for example, can be a dual ported RAM (e.g., having an access time of less than 15 nanoseconds) which has a data error output 17' provided to an ADC compensate node, e.g., first and second registers 18', 19' and a combiner to combine the second register output with the first register output, such as a subtractor 20 positioned to subtract an output of the second register 19' from the output of the first register 18, to thereby provide a compensated digital output 25'.

Figure 4:
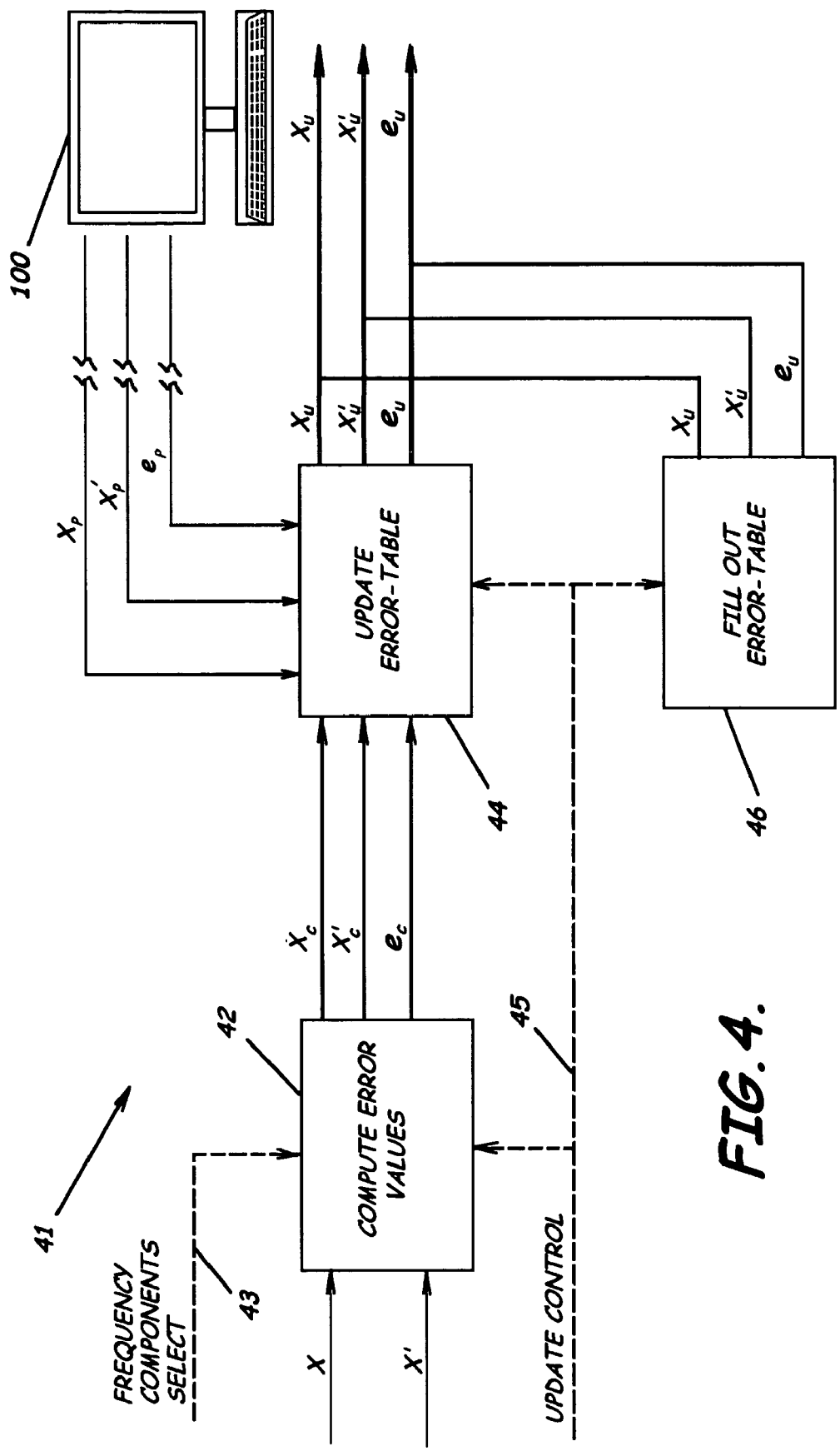
FIG. 4 is a schematic diagram of an error-table compensating processor of an ADC compensating apparatus according to an embodiment of the present invention.

As perhaps best shown in FIG. 4, the error-table processor 41, for example, can be provided by an error calculator 42 positioned to receive the state value signal x and the slope value signal x' and to calculate or compute error values. The error calculator 42 also receives a frequency component select signal 43 and an update control signal 45. An update error-table function block 44, as understood by those skilled in the art (see also FIG. 6), receives an error-state value $x_c$, an error slope value $x_c'$, and an error control value $e_c$ from the error calculator 42. The update error-table function block 44 also receives an updated processor state value $x_p$, an updated processor slope value $x_p'$, an updated control signal 45, and an updated error processor value $e_p$. The update error-table function block 44, in turn, has an output of an updated state value $x_u$ and an updated slope-value $x_u'$ supplied as inputs to another or second address 36 of the memory 35 and an updated error value $e_u$ supplied as an input to data input 37. Hence, each of the outputs $x_u$, $x_u'$, $e_u$ of the error-table processor 44 are provided as inputs to the memory 35 having the error-table or error data stored therein (see FIGS. 3–4). Also, a fill-out error-table function block 46, as understood by those skilled in the art (see also FIG. 7) is positioned to receive the updated error value $e_u$, the updated state value $x_u$, and the updated slope value $x_u'$ and to provide a fill-out output to the update error-table, e.g., the update control signal 45 (see FIG. 4).

Figure 5:
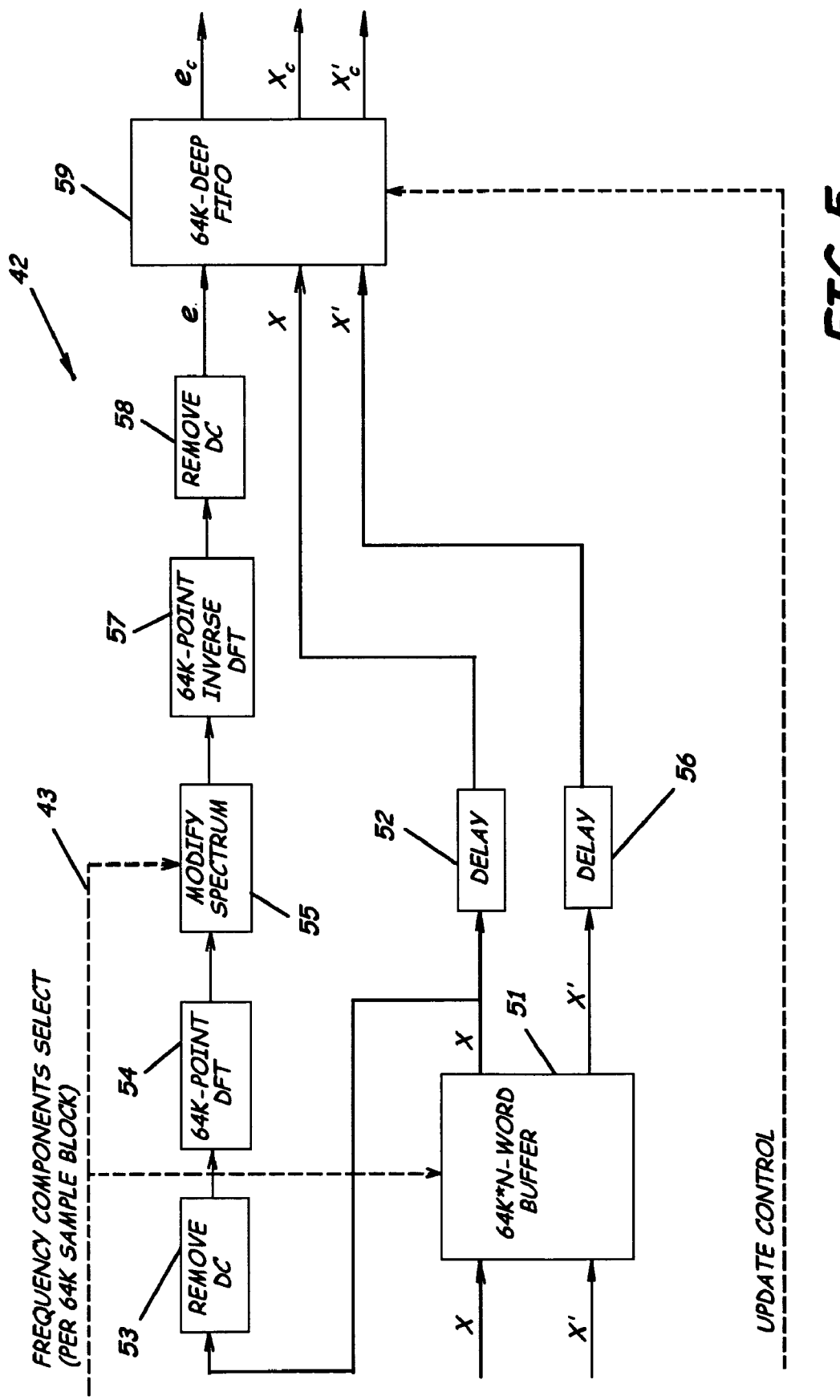
FIG. 5 is a schematic diagram of a method to compute error values according to an embodiment of the present invention.

FIG. 5 illustrates an embodiment of an error calculator 42 of an update error processor 41 according to the present invention. The error calculator 42, for example, can include a buffer 51, e.g., a 64K by N-word buffer as understood by those skilled in the art, positioned to receive the state value x and the slope value x' to thereby buffer N blocks of 64K samples or words. A direct current (DC) component (or equivalently, the zero-frequency component) is removed 53 from the block of 64K samples (i.e., the mean value of the block of 64K samples after DC removal is zero) and provided as an input to a 64K-point DFT 54 which is executed for 64K time domain samples. A frequency component select signal 43 (per 64K sample block) is also provided as an input to a modify spectrum function block 55. This signal 43 is used to select which frequency components to retain or discard in the modify spectrum function block 55 and, as understood by those skilled in the art, is dependant on the calibration signal that is inputted to the ADC during creation, build-up, or update of the error table. This, in turn, results in a frequency spectrum 55 containing a calibration signal component and the spurious signal components that are desired to be removed. The desired spurious components are saved, and all other components are removed from the spectrum. A 64K-point inverse DFT 57 is executed, resulting in an error waveform. The direct current component or non-zero mean value is again removed 58. The error values then are passed to the functional block, e.g., 64K-deep FIFO 59, that updates the update error-table function block 44. As illustrated and described herein, the functional blocks can be accomplished by hardware, software, and/or firmware as understood by those skilled in the art. The memory can be random access memory or other types of memory to accomplish this function as understood by those skilled in the art.

Embodiments of an apparatus and methods of the present invention, for example, compensate an output of an ADC by removing non-linearities and other spurious components due to the ADC itself or due to non-linear effects preceding the ADC. Embodiments of an apparatus for compensating an ADC according to the present invention, for example, can use dual port memory (error-table) that is addressed sample-by-sample by data-pairs of ADC output values (state values) and sampled estimates of the slope of an input signal (slope values). The state-slope pairs address the dual-ported memory, e.g., random access memory (RAM), and produce compensatory values, which then are applied to the ADC output samples. The result is a compensated ADC signal with undesired components removed or reduced in amplitude.

Figure 6:
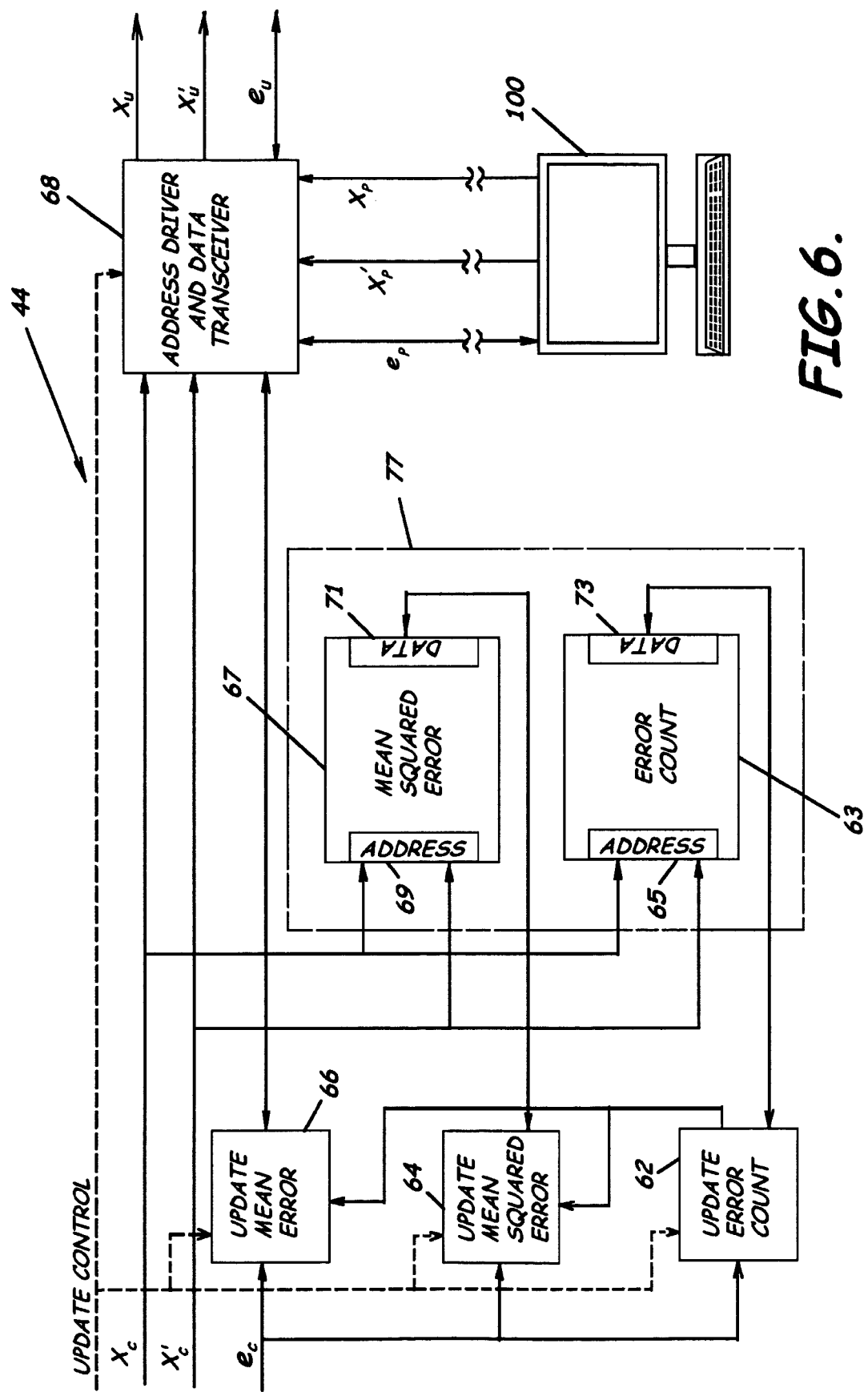
FIG. 6 is schematic diagram of an error-table compensating processor of an ADC compensating apparatus according to an embodiment of the present invention.

FIG. 6 shows how the error-table is updated. Each state-slope pair is input to the update error-table functional block 44 (see FIG. 4), and the updated error-table functional block 44 determines, e.g., computes, a new updated error value as a weighted sum of the old or previous error value resident in the error-table and the newly computed or updated error value. The weighting, for example, uses the sample update error count value 62 stored for the corresponding error value, and this sample update error count value 62 is incremented by unity for each new incoming error value and is associated with that error value in a corresponding location in separate error count memory 63, e.g., separate RAM having address 65 and data 73 inputs, of an error memory 77. The update mean square value 64 is computed in a similar fashion where the newly computed error value is squared, and combined in a weighted sum with the old mean squared value in the corresponding location in a separate mean squared error memory 67, e.g., separate RAM, holding the mean squared values, and having address 69 and data 71 inputs. For each new incoming error value, the associated sample count value is incremented by unity and stored in its respective location in the error count memory 63, e.g., RAM.

FIG. 6 also shows the access to the update error-table function block 44, the mean squared values, and the sample count values by an externally attached computer 100, as will be understood by those skilled in the art, through an address driver and data transceiver 68, as also understood by those skilled in the art. This access, for example, enables the external computer 100, i.e., using monitoring and/or updating software as understood by those skilled in the art, to monitor performance of the updated error-table in terms of its statistical distribution of error values, including the mean values, mean squared values standard deviation values, and any other statistical information or distributions that may be derived from the existing data contained in the error-table and associated means squared and sample count tables. Additionally, as understood by those skilled in the art, the external computer 100 can modify any error-table location that it judges necessary to improve or enhance ADC compensation performance characteristics. Embodiments of the present invention hereby provide an apparatus and methods which further permit external statistical analysis of an error-table through the use of an attached external computer. This feature, for example, advantageously permits analysis of trends in the change of the error-table as time elapses. Such changes, for example, can be due to temperature, aging, and type of components preceding the ADC.

Figure 7:
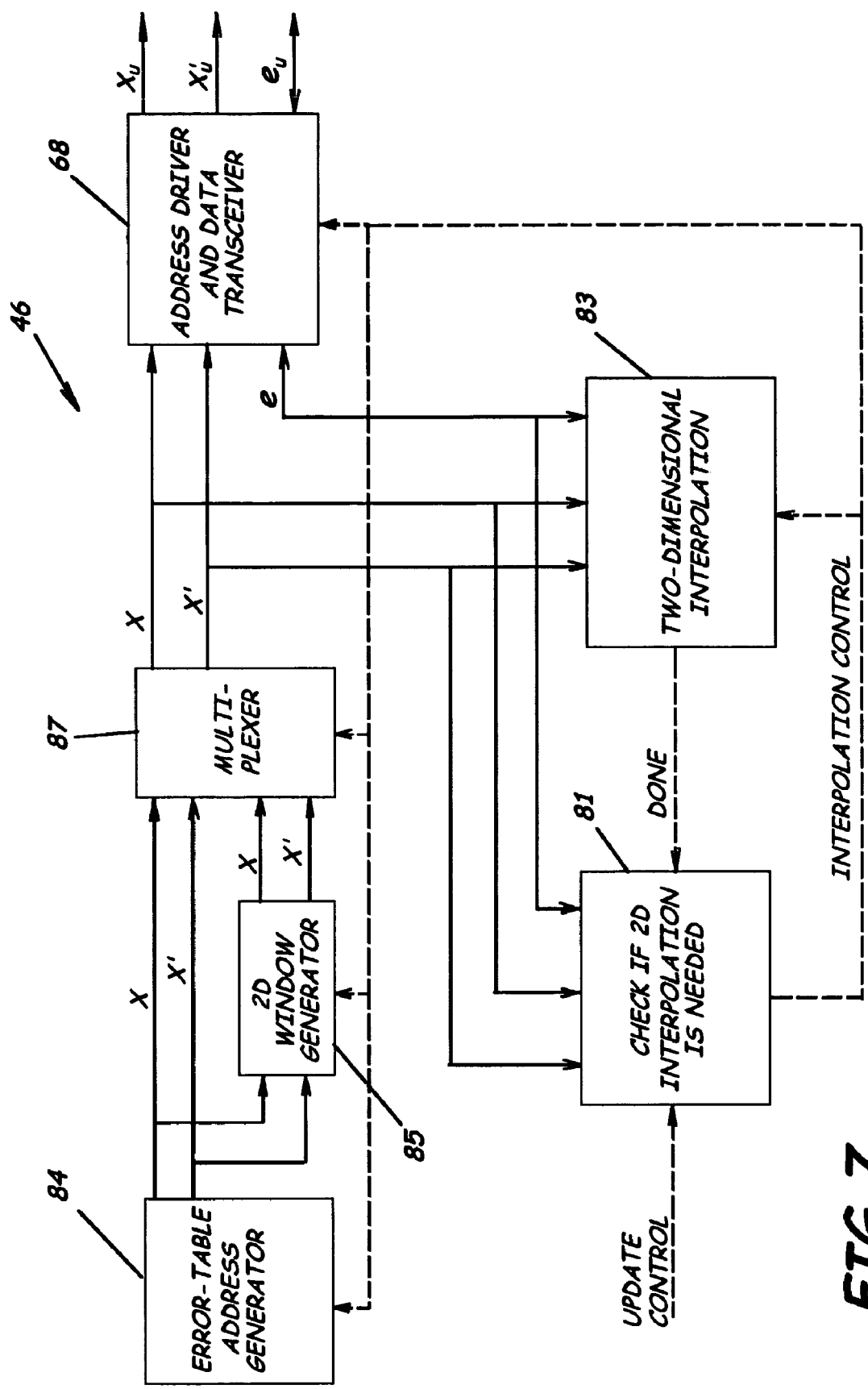
FIG. 7 is a schematic diagram of a method to fill-out regions of an error-table of an ADC compensating apparatus according to an embodiment of the present invention.

FIG. 7 shows how regions of the error-table are filled in or completed (see functional block 46 of FIG. 4). Due to the nature of the calibration signals (e.g., single frequency or multiple frequencies and applied in succession or in combination when building the error-table as understood by those skilled in the art) used to compute error values for the error-table, not all locations of the error-table may be addressed. To fill in 46 the locations of the error-table that have not been covered, an error-table address generator 84 spans all locations of the error-table, and a determination is made if any location of the table needs to be computed. A location in the error-table needs to be filled in if the corresponding sample count value is zero, indicating no error value is present for that location, or if the number of error samples at that location is a relatively low number, for example, one or two samples out of at least an order of magnitude more for other samples in its neighborhood. A multiplexer 87, as understood by those skilled in the art, is responsive to the error-table address generator 84 to assist with this fill-in function.

If an error value needs to be interpolated, a two-dimensional interpolation 81 over that window is executed by a 2D window generator 85. Although there are many interpolation algorithms available such as a triangle-based linear or cubic interpolation, the interpolation that perhaps produces the best result (and preferred) is biharmone spline interpolation due to Sundwell (see, e.g., Sundwell, David T., "Biharmonic Spline Interpolation of GEOS-3 and SEASAT Altimeter Data," Geophysical Research Letters 2, 139–142, 1987) and which is incorporated herein by reference in its entirety.

During interpolation 83 at the point of interest, the single interpolated point may be taken, and then the two-dimensional window may be moved to the next point of interest for a new interpolation. This technique results in each point computed based on the available error values within the two-dimensional window. For faster interpolation processing, as understood by those skilled in the art, a subset or the whole number of values of the two-dimensional interpolation window can be taken to fill in empty error values.

When interpolation involves computing more than one point at a selected location, edge effects may arise and are mitigated by a combination of overlap-add and weighting the two-dimensional window as it moves throughout the error-table. An example of a weighing function for the two-dimensional window is a two-dimensional Gaussian function placed on the center of the window with a standard deviation equal to one-half of its overlap value. Accordingly, embodiments of the present invention provide an apparatus and methods which perform real-time compensation of any ADC output by correcting for any non-linearities introduced by the ADC itself or introduced by any components preceding it. Updates to an error-table are done simultaneously with compensation as the ADC is periodically re-calibrated, and thus, the compensation can more closely track any environmental system changes to the ADC or any components preceding it.

As illustrated in FIGS. 1–7, and as described above herein, embodiments of methods to enhance compensation of an analog-to-digital converter (ADC) output are also provided according the present invention. For example, an embodiment of a method includes providing a digital output of an ADC, compensating for error in the digital output responsive to an error-table, and dynamically updating the error-table. This dynamic updating can include determining an updated error-value for the error-table responsive to a weighted sum of a previous error value in the error-table and the updated error value. The method can also include accessing the updated error-table to monitor performance of the updated error-table for statistical distribution of error values via an external computer and modifying an error-table location to enhance ADC compensation performance characteristics.

Embodiments of the present invention advantageously provide an apparatus and associated methods to enhance compensation in an analog-to-digital converter (ADC) in real time and that periodically refreshes an error-table with up-to-date compensation data. The up-to-date compensation data advantageously can be based on present environmental conditions directly and indirectly related to the ADC's operation and performance in a desired application. Embodiments of the present invention advantageously provide an apparatus and associated methods to perform real-time compensation of an ADC output signal and simultaneously update an error-table as new error values are calculated. Embodiments of the present invention additionally advantageously provide an apparatus and associated methods that allow for use of calibration signals that only cover part of an error-table; the remainder of the error-table is filled in through the use of two-dimensional interpolation using error values previously computed with the calibration signals.

In the drawings and specification, there have been disclosed embodiments of the invention and, although specific terms are employed, they are used in a generic and descriptive sense only and not for the purpose of limitation, the scope of the invention being set forth in the following claims.

What is claimed is:

1. An apparatus to enhance compensation of output of an analog-to-digital converter (ADC), the apparatus comprising:
   an ADC having an analog input, a clocking input, and a digital output;
   a state-slope sampler including:

a delay positioned to receive the digital output from the ADC as an input and the clocking input and having a delay output indicating a state value, and a differentiator also positioned to receive the digital output from the ADC as an input and the clocking input to differentiate the digital output from the ADC and having a differentiator output indicating a slope value;

a compensator including:

memory positioned to receive the delay output and the differentiator output and having an error-table associated therewith, a first address input receiving each of the respective delay and differentiator outputs, a second address input, an error data input, and an error data output, a first register also positioned to receive the delay output and the clocking input and having a first register output, a second register positioned to receive the error data output and the clocking input and having a second register output, and a combiner positioned to receive the first register output and the second register output and to combine the second register output with the first register output to thereby compensate the first register output by the second register output; and a compensating error processor positioned to receive the delay output, the differentiator output, and the clocking input, to compute new updated error-table values, and to update selected locations in the error-table associated with the memory with the updated error-table values, the compensating error processor having first and second updated processor outputs and an updated error output, the first and second updated processor outputs being positioned to be inputted to the second address input of the memory and the updated error output being positioned to be inputted to the error data input of the memory so that the updated error values compensate the error-table associated with the memory.

2. An apparatus as defined in claim 1, wherein the compensating error processor further includes a frequency component select input, an update control input, an external processor input.

3. An apparatus as defined in claim 1, wherein the compensating error processor comprises an error calculator to calculate the updated error values and an updated slope-value, and an updated error-value.

4. An apparatus as defined in claim 3, wherein the compensating error processor further comprises a fill-out output to update the error-table within the memory.

5. An apparatus as defined in claim 3, wherein the error calculator comprises a buffer positioned to receive the state value and the slope value to thereby buffer selected blocks of samples of state values, a frequency spectrum generator responsive to the buffer to generate a frequency spectrum having a calibration signal component and spurious signal components desired to be removed, an error waveform generator responsive to the frequency spectrum generator to generate an error waveform, at least one delay responsive to the state and slope values from the buffer, and first-in-first-out memory (FIFO) responsive to the error waveform and the output of the delay to update the updated error-table with the updated error values.

6. An apparatus as defined in claim 3, wherein the compensating error processor is responsive to each pair of state-slope values to compute a new error value as a weighted sum of a previous error value resident in the error-table of the memory and the new error value.

7. An apparatus as defined in claim 6, wherein updated error-table comprises an update error counter responsive to an error control signal to update an error count, an update mean squared error calculator responsive to the error control signal to calculate an updated mean squared error, an update mean error controller to calculate an updated mean error, and an address driver and data transceiver responsive to the state control values, slope control values, the updated mean squared error value, and the updated error count to provide updated state values, updated slope values, and updated error values therefrom.

8. An apparatus as defined in claim 7, further comprising an external computer in communication with the address driver and data transceiver to monitor performance of the updated error-table and to selectively modify values within an error-table location, to thereby further enhance ADC compensation performance.

9. An apparatus to enhance compensation of output of an analog-to-digital converter (ADC), the apparatus comprising:

an ADC;

a state-slope sampler responsive to output data of the ADC to produce a state sample and a slope sample;

a compensator including:

memory responsive to the plurality of state-slope samples and having error data associated therewith to thereby produce a plurality of compensation samples, and a combiner positioned to combine each of the plurality of compensation samples from each of the plurality of state-slope samples; and a compensating error processor positioned to update the error data associated with the memory.

10. An apparatus as defined in claim 9, wherein the compensating error processor further includes a frequency component select input, an update control input, an external processor input.

11. An apparatus as defined in claim 9, wherein the compensating error processor comprises an error calculator to calculate updated error values and an updated slope-value, and an updated error-value.

12. An apparatus as defined in claim 11, wherein the compensating error processor further comprises a fill-out output to update the error data within the memory.

13. An apparatus as defined in claim 11, wherein the error calculator comprises a buffer positioned to receive the state value and the slope value to thereby buffer selected blocks of samples of state values, a frequency spectrum generator responsive to the buffer to generate a frequency spectrum having a calibration signal component and spurious signal components desired to be removed, an error waveform generator responsive to the frequency spectrum generator to generate an error waveform, at least one delay responsive to the state and slope values from the buffer, and first-in-first-out memory (FIFO) responsive to the error waveform and the output of the delay to update the updated error-table with the updated error values.

14. An apparatus as defined in claim 11, wherein the updated error-table is responsive to each pair of state-slope values to compute a new error value as a weighted sum of a previous error value resident in the error-table and the new error value.

15. An apparatus as defined in claim 14, wherein updated error-table comprises an update error counter responsive to an error control signal to update an error count, an update mean squared error calculator responsive to the error control signal to calculate an updated mean squared error, an update mean error controller to calculate an updated mean error, and an address driver and data transceiver responsive to the state control values, slope control values, the updated mean squared error value, and the updated error count to provide updated state values, updated slope values, and updated error values therefrom.

16. An apparatus as defined in claim 15, further comprising an external computer in communication with the address driver and data transceiver to monitor performance of the updated error-table and to selectively modify values within an error-table location, to thereby further enhance ADC compensation performance.

17. A method to enhance compensation of an analog-to-digital converter (ADC) output, the method comprising:

providing a digital output of an ADC;

compensating for error in the digital output responsive to an error-table; and dynamically updating the error-table, the dynamically updating of the error-table including determining an updated error-value for the error-table responsive to a weighted sum of a previous error value in the error-table and the updated error value.

18. A method as defined in claim 17, further comprising accessing the updated error-table to monitor performance of the updated error-table for statistical distribution of error values via an external computer.

19. A method as defined in claim 18, further comprising modifying an error-table location to enhance ADC compensation performance characteristics.

* * * * *